(12) United States Patent
Lissmats et al.

(10) Patent No.: US 11,910,962 B2
(45) Date of Patent: Feb. 27, 2024

(54) SENSOR DEVICE AND METHOD FOR DETECTING A FILLING STATUS OF DISPENSER FOR A CONSUMABLE

(71) Applicant: Essity Hygiene and Health Aktiebolag, Gothenburg (SE)

(72) Inventors: Johan Lissmats, Borlange (SE); Gunilla Himmelmann, Gothenburg (SE)

(73) Assignee: ESSITY HYGIENE AND HEALTH AKTIEBOLAG, Gothenburg (SE)

( * ) Notice: Subject to any disclaimer, the term of this patent is extended or adjusted under 35 U.S.C. 154(b) by 441 days.

(21) Appl. No.: 17/414,071

(22) PCT Filed: Dec. 21, 2018

(86) PCT No.: PCT/EP2018/086607
§ 371 (c)(1),
(2) Date: Jun. 15, 2021

(87) PCT Pub. No.: WO2020/126036
PCT Pub. Date: Jun. 25, 2020

(65) Prior Publication Data
US 2022/0036687 A1    Feb. 3, 2022

(51) Int. Cl.
*A47K 10/34*    (2006.01)
*A47K 10/38*    (2006.01)
(Continued)

(52) U.S. Cl.
CPC .............. *A47K 10/34* (2013.01); *A47K 10/38* (2013.01); *B65H 26/08* (2013.01); *B65H 35/002* (2013.01);
(Continued)

(58) Field of Classification Search
CPC ........ A47K 10/34; A47K 10/38; G06F 18/256
See application file for complete search history.

(56) References Cited

U.S. PATENT DOCUMENTS 8,917,100 B2 * 12/2014 Monti .................... G01N 33/15
221/7
2011/0084709 A1    4/2011 Asjes et al.
(Continued)

FOREIGN PATENT DOCUMENTS

CN    103096771 A    5/2013
CN    103528603 A    1/2014
(Continued)

OTHER PUBLICATIONS

International Searching Authority, Search Report and Written Opinion issued in PCT/EP2018/086607, dated Nov. 12, 2019 (19 pages).
(Continued)

*Primary Examiner* — Gene O Crawford
*Assistant Examiner* — Ayodeji T Ojofeitimi
(74) *Attorney, Agent, or Firm* — CANTOR COLBURN LLP (57) ABSTRACT

A sensor device is provided to detect a filling status of a consumable in a dispenser, the consumable being web material, and the filling status relating to a spatial extension of the consumable in the dispenser. The sensor device includes a capacitive sensor having an elongated and planar sensor area; and a first measurement section configured to measure the filling status of the dispenser. The capacitive sensor includes a first channel and a second channel. The first measurement section is configured to measure the filling status of the dispenser based on changes in capacitance detected by the first channel and the second channel.

13 Claims, 7 Drawing Sheets

(51) Int. Cl.
    *B65H 26/08*      (2006.01)
    *B65H 35/00*      (2006.01)
    *G06F 18/25*      (2023.01)
    *G07F 9/02*      (2006.01)
    *H03K 17/955*      (2006.01)

(52) U.S. Cl.
    CPC ............ *G06F 18/256* (2023.01); *G07F 9/026* (2013.01); *H03K 17/955* (2013.01); *B65H 2301/415016* (2013.01); *B65H 2301/41524* (2013.01); *B65H 2511/14* (2013.01); *B65H 2511/18* (2013.01); *B65H 2553/23* (2013.01); *B65H 2701/11231* (2013.01); *G06F 2218/00* (2023.01); *H03K 2217/96078* (2013.01)

(56) References Cited

U.S. PATENT DOCUMENTS

| | | | | |
|---|---|---|---|---|
| 2014/0367401 | A1* | 12/2014 | Stralin | A47K 10/38 221/6 |
| 2015/0021225 | A1* | 1/2015 | Van Diepen | B65D 83/0817 206/494 |
| 2016/0051176 | A1 | 2/2016 | Ramos et al. | |

FOREIGN PATENT DOCUMENTS

| | | |
|---|---|---|
| CN | 103997939 A | 8/2014 |
| CN | 104188587 A | 12/2014 |
| CN | 104209346 A | 12/2014 |
| CN | 204374734 U | 6/2015 |
| CN | 105025809 A | 11/2015 |
| CN | 105916423 A | 8/2016 |
| CN | 106411309 A | 2/2017 |
| CN | 107884456 A | 4/2018 |
| ES | 2564007 T3 | 3/2016 |
| WO | 2018044276 A1 | 3/2018 |

OTHER PUBLICATIONS

Chinese Application No. 201880100283.3; Office Action with English Translation dated Jan. 6, 2023; 15 pages.

Chinese Application No. 201880100283.3; Office Action with English Translation dated Aug. 11, 2022; 20 pages.

Chinese Application No. 201880100283.3; Office Action with English Translation dated Mar. 7, 2022; 17 pages.

European Application No. 18826720.7; Communication pursuant to Article 94(3) EPC; dated Jul. 24, 2023; 8 pages.

\* cited by examiner

SENSOR DEVICE AND METHOD FOR DETECTING A FILLING STATUS OF DISPENSER FOR A CONSUMABLE

CROSS-REFERENCE TO RELATED APPLICATION

This application is a national phase entry of, and claims priority to, International Application No. PCT/EP2018/086607, filed Dec. 21, 2018, which is incorporated herein by reference in its entirety.

TECHNICAL FIELD

This application relates to a sensor device and a method thereof for detecting a filling status and counting refill bundles of a dispenser, with the consumable (refill bundles) being web material and the filling status relating to a spatial extension of the consumable in the dispenser, with the sensor device including a capacitive sensor and a first measurement section.

BACKGROUND

Today, the need for proper hygiene, in particular in the form of hand hygiene, is widely acknowledged. For this reason, public or commercial facilities such as washrooms in public buildings, offices, restaurants, airports, hospitals, shopping malls and so on are normally provided with dispensers for various consumable goods, for example paper towels, liquid soap, toilet paper, diapers, or sanitary napkins. The purpose is to make such consumables easy available to the guests in the washrooms.

Consumables are normally stored in said dispensers, which for this purpose are fixedly located at suitable positions in the washroom. A dispenser can for example be in the form of a holder for paper towels, a holder for toilet paper, a holder for diapers, a holder for sanitary napkins, or a container for liquid soap. Other types of hygiene equipment, for example waste bins, are also used. The task of checking the level of each consumable, and refilling a dispenser when needed, i.e., when the level of the consumable is low, or emptying a bin when the level of the consumable is high, is normally assigned to a cleaning staff or a janitor.

One problem for a janitor is to know which dispensers need to be refilled and how much consumable material to bring when servicing an area containing a number of dispensers. Furthermore, from a management point of view, it can be difficult to know in advance how many consumable materials should be ordered and kept in stock. For these reasons, there is a need for dispensers which are arranged for monitoring the actual use of the consumable and for signaling in some suitable manner to a central service office that, for example, a particular dispenser needs refilling. To this end, it is known that a modern dispenser may comprise one or more sensors which are arranged for detecting the level of the consumable within the dispenser. Generally, such sensors can be arranged for recognizing any condition indicating that the level of a consumable is low, i.e., by detecting that the level of the consumable is below a predetermined threshold value. The sensor in question can, for example, be based on an infrared sensor which is arranged for detecting when the height of a paper stack, such as a stack of paper towels in a dispenser, falls below a specified low paper threshold. This threshold corresponds to a condition in which the dispenser needs refilling.

There exist also solutions in which a dispenser is arranged for automatically dispensing a consumable. An example is an automatic soap dispenser which is arranged for automatically discharging a small amount of soap when a user holds a hand under an output nozzle of the dispenser. Such a dispenser can be arranged with sensor arrangements which keep track of the number of occasions that the nozzle has been actuated. The number of occasions can then be used for estimating the amount of consumable which has been fed from the dispenser, and consequently also the remaining amount. When a predetermined minimum threshold has been reached, the dispenser can send a signal to a central service office indicating that it needs refilling.

Other types of sensors can for example be based on time-of-flight, or on a light emitting diode and a photodetector which together can be used for detecting the level of a consumable within a dispenser. A further example is a counter device counting the number of turns on a toilet paper dispenser, wherein the accumulated number of turns corresponds to a certain consumption of toilet paper.

As mentioned above, a sensor which is associated with a dispenser for a consumable can be connected to a central service office, i.e., to a central computer server, so that the server is notified when a particular dispenser needs refilling. A notification relating to a dispenser low condition can then be forwarded to members of a cleaning staff, who then has the responsibility of refilling that particular dispenser as soon as possible.

A particular problem which is relevant with regard to a monitoring system of the above-mentioned type is that the sensors of the above-mentioned type, i.e., for example infrared sensors or sensors being based on a light emitting diode and a photodetector, do not fulfill all demands regarding collection of data in order to, for example, alert when refilling of a dispenser is needed, alarm when a dispenser is nearly empty, and/or count refills. One dispenser may be a dispenser of large size, wherein a dispenser of large size can store a plurality of refill bundles and wherein the number of refill bundles shall be counted. To be able to count bundles with today's sensor types, multiple sensors are sometimes required which result in problems concerning back-office solution, the back-office solution being able to solely manage a maximum of two sensors. In addition, the cost for multiple sensors is relative high.

Another problem may arise in situations when the filling status of a dispenser must be measured with high granularity to accurately and precisely detect the filling status of the dispenser. One exemplary situation may be during highly frequented events, when washrooms are used frequently and the cleaning staff must refill a plurality of dispensers in many washrooms distributed over a large area. In this kind of scenario, a high granularity for the sensors measuring the filling status of the dispensers is needed such that the cleaning staff is able to accurately and efficiently refill the corresponding dispensers.

Another problem may arise in specific dispenser types, wherein it is difficult to accurately measure refills. These kinds of dispensers may contain, for example, a paper roll where paper is consumed from the inside of the roll and thus the dimension of the paper roll remains the same regardless of whether the dispenser needs to be refilled or not.

It would thus be desirable to provide an improved sensor to detect a filling status of a consumable in a dispenser. Consequently, it is an object of the present invention to solve the above-mentioned problem and provide a sensor which broadens the scope of dispenser types that have full functionality and provide more accurate data. In particular, it is an object of the present invention to provide a sensor which measures the status of a dispenser more accurately and can be mounted in any type of dispenser.

SUMMARY

The technical problems identified above are solved by the subject-matter of the various embodiments described below.

According to one embodiment of the present invention, there is provided a sensor device arranged to detect a filling status of a consumable in a dispenser, the consumable being web material and the filling status relating to a spatial extension of the consumable in the dispenser. The sensor device comprises a capacitive sensor comprising an elongated and planar sensor area; and a first measurement section configured to measure the filling status of the dispenser. The capacitive sensor is configured with a first channel and a second channel, wherein the first measurement section is configured to measure the filling status of the dispenser based on changes in capacitance detected by the first channel and the second channel.

According to another embodiment of the present invention, there is provided a dispenser for dispensing consumable, the consumable being web material. The dispenser comprises a storage section arranged to hold and support the consumable; a loading opening arranged for filling up the dispenser with the consumable; and a dispensing opening from which the consumable is arranged to be lead for dispensing thereof. The dispenser furthermore comprises a sensor device arranged to detect a filling status of the consumable in the dispenser, the filling status relating to a spatial extension of the consumable in the dispenser. The sensor device comprises a capacitive sensor comprising an elongated and planar sensor area; and a first measurement section configured to measure the filling status of the dispenser. The capacitive sensor is configured with a first channel and a second channel, wherein the first measurement section is configured to measure the filling status of the dispenser based on changes in capacitance detected by the first channel and the second channel.

According to a further embodiment of the present invention, there is provided a method for detecting a filling status of a consumable in a dispenser, the consumable being web material, the filling status relating to a spatial extension of the consumable in the dispenser. The method comprises the steps of detecting changes in capacitance by a capacitive sensor comprising an elongated and planar sensor area; and measuring, by a first measurement section, the filling status of the dispenser depending on the detected changes in capacitance. In this matter, the capacitive sensor comprises a first channel and a second channel; and the first measurement section is configured to measure the filling status of the dispenser based on changes in capacitance detected by the first channel and the second channel.

BRIEF DESCRIPTION OF THE DRAWINGS

The features and advantages of the invention will be appreciated upon reference to the following drawings. The accompanying drawings, which are incorporated in and constitute a part of this specification, illustrate one or more embodiments of the invention and, together with the general description given above and the detailed description given below, explain the one or more embodiments of the invention. Embodiments of the present invention, which are presented for better understanding the inventive concepts and which are not to be seen as limiting the invention, will now be described with reference to the following Figures.

FIG. 7B is a schematic flow chart of yet another method for detecting a filling status of a consumable in a dispenser.

DETAILED DESCRIPTION

Implementations of the present invention will now be described more fully with reference to the accompanying drawings, in which example embodiments are shown. However, this invention should not be construed as limited to the embodiments set forth herein.

Disclosed features of example embodiments may be combined as readily understood by one of ordinary skill in the art to which this invention belongs.

Figures 1A, 1B, 1C, 1D:
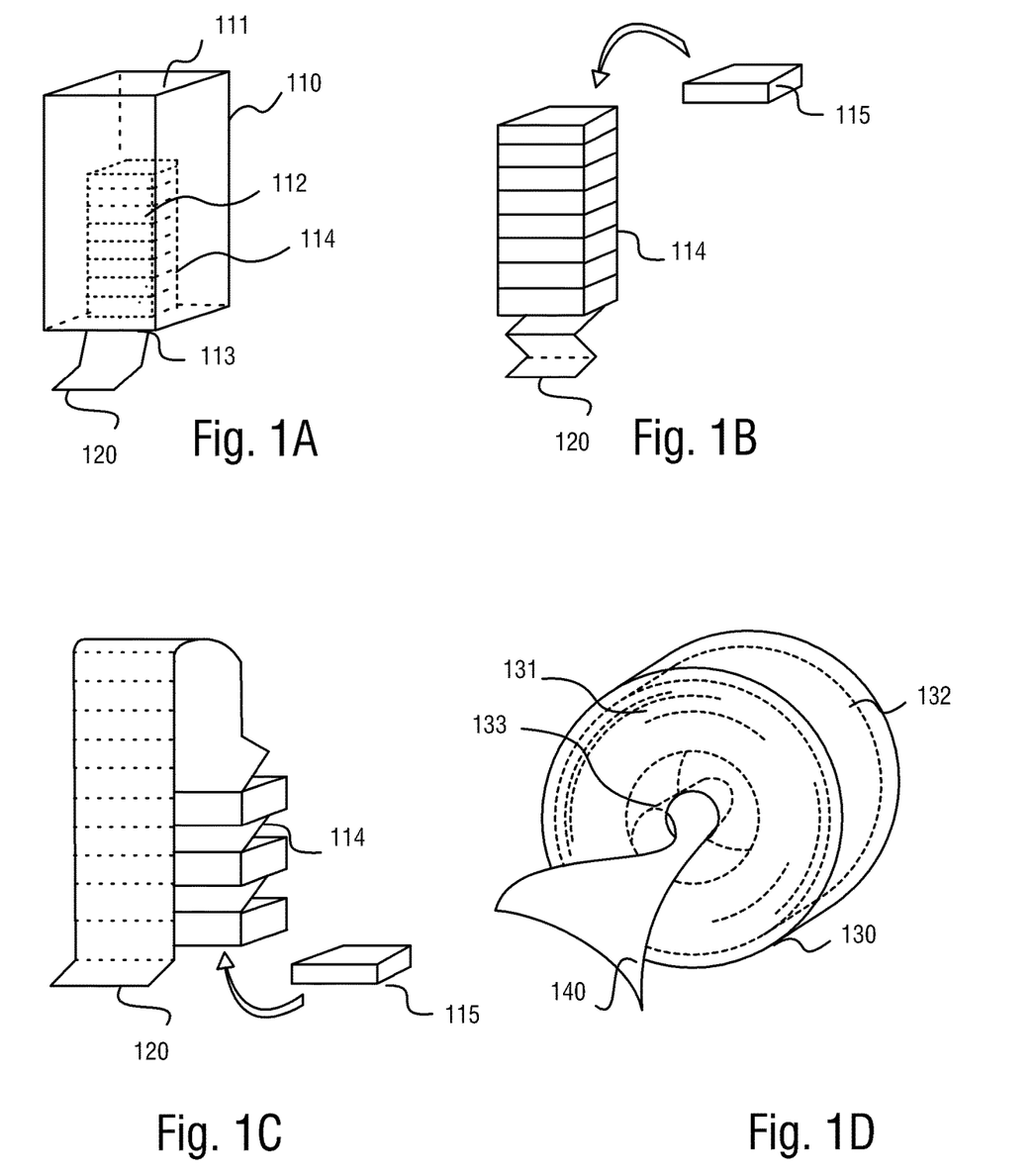
FIG. 1A is a perspective view of a dispenser storing a stack of web material.
FIG. 1B is a perspective view of a stack of web material that may be used with the dispenser of FIG. 1A.
FIG. 1C is a perspective view of another type of stack of web material that may be used with the dispenser of FIG. 1A.
FIG. 1D shows another dispenser storing a roll of web material.

FIG. 1A shows an example of a hygiene equipment, in this embodiment a dispenser 110 for dispensing consumable 120, the consumable 120 being one end of web material.

Web material may be continuous or non-continuous sheets of paper towels, toilet paper, tissue paper, facial tissues, nonwoven wipe, etc. in either folded or rolled form, e.g., stack or roll. In other words, the consumable 120 may be web material of continuous or non-continuous sheets of paper towels, toilet paper, tissue paper, facial tissues, or nonwoven wipe, the sheets being folded into stacks or rolled into a roll.

The dispenser 110 may have a storage section 111 arranged to hold and support the consumables to be stored in the dispenser and a loading opening arranged to filling up the dispenser with the consumable to be stored. The loading opening may be covered, for instance, by a door 112 shown in FIG. 1A, wherein the door 112 may be locked or unlocked. The door 112 may be opened to reveal the loading opening. In other embodiments, no door 112 for covering the loading opening may be provided at all. The shape and construction of the dispenser 110 may differ from FIG. 1A and are not limited to the embodiment as shown in FIG. 1A.

The dispenser 110 of FIG. 1A may further comprise a dispensing opening 113 from which the consumable 120 is arranged to be lead for dispensing thereof. In this embodiment, the dispensing opening 113 is shown at the bottom of dispenser 110. The dispensing opening 113, however, is not limited to the construction as shown in the embodiment of FIG. 1A. The dispensing opening 113 may be arranged in any other place of the dispenser 110, such that a user can easily grab web material.

In FIG. 1A, a stack of web material 114 is shown with dotted lines, wherein the stack of web material 114 may consist of multiple bundles of web material which are stored in dispenser 110. When the dispenser 110 is refilled, the dispenser 110 may be loaded with refill bundles of web material.

FIG. 1B illustrates the stack of web material 114 without dispenser 110, wherein the stack of web material 114 consists of multiple bundles. The web material may be provided as a continuous web material which is folded to form a folded web material. Similarly, a stack of folded web material for replenishing the folded web material in a dispenser may comprise a continuous web material. Herein, the term "replenishing" or "loading" not only relates to the replenishing or loading of a dispenser which is partially filled with a stack of folded web material but is understood to also encompass loading of an empty dispenser. The continuous web material may be separated during dispensing. Dispensed sheets of web material from the dispenser may be used as towels, napkins, for general wiping, etc. The folded web material may be Z-folded in an accordion-like manner to form the stack of folded web material, as illustrated in FIG. 1B. A refill bundle of web material 115 may be put on top of the stack of web material 114 for refilling the dispenser 110. If the dispensing opening 113 is located at the top of the dispenser 110, the refill bundle of web material 115 may be placed at the bottom of the stack of web material 114.

FIG. 1C shows another embodiment of a stack of web material 114 which can be stored in a respective dispenser, wherein the web material may be Z-folded in an accordion-like manner to form a stack of folded web material. Again, the stack of web material 114 consists of multiple bundles of web material. In this embodiment as illustrated in FIG. 1C, the continuous web material, when being in the corresponding dispenser, is pulled upwards from the uppermost bundle by parts of the dispenser, is turned around at the top of the dispenser and continues downwards. Individual sheets of web material will then be dispensed at the bottom of the dispenser by a special separation unit or by any other suitable device. The dispenser may be refilled with a refill bundle 115 from the bottom of the stack of web material 114.

FIG. 1D shows another embodiment of a dispenser 130 for dispensing consumable 140, the consumable 140 being web material rolled up on a roll 132 located inside of the dispenser 130. The consumable 140 may be a paper roll 132 where paper is consumed from the inside of the roll or a paper roll where paper is consumed from the outside of the roll.

The dispenser 130 may have a storage section 131 similar to storage section 111 shown in FIG. 1A arranged to hold and support the consumable 140 to be stored in the dispenser and a loading opening arranged to filling up the dispenser with the consumable 140 to be stored. The loading opening may or may not be covered by a door (not explicitly shown in FIG. 1B), wherein different embodiments for covering the loading opening have been described above and can be also applied to dispenser 130. The shape and construction of the dispenser 130 may differ from FIG. 1D and are not limited to the embodiment as shown in FIG. 1D.

The dispenser 130 of FIG. 1D may further comprise a dispensing opening 133 from which the consumable 140 is arranged to be lead for dispensing thereof. In this embodiment, the dispensing opening 134 is shown centric of the front side of the dispenser 130. However, the dispensing opening 134 may be arranged in any other place of the dispenser 130, such that a user can easily grab web material.

The dispensers 110 and 130 of FIGS. 1A and 1D may be standalone units or may be mounted to a structure such as a wall, a piece of furniture, or a door. The dispensers 110 and 130 may be arranged for manual dispensing of web material through the dispensing openings 113 and 133 by a user, the user, for example grabbing sheets of material, like tissues, towels, or the like or by a user pulling on a tail of the consumable 120, 140 (e.g., web material). The dispensers 110 and 130 may alternatively be arranged for automatic dispensing of web material through the dispensing openings 113 and 133. The automatic dispensing may comprise electrically powered feeding of web material or a mechanical feeding of web material. In both cases a user may actuate the feeding.

The web material may comprise one or more web layers. In the case of more than one web layer, the layers are interfolded in the stack. One or more sheets of web material may be separated from the web material in the dispenser during dispensing from the dispenser. For this purpose the web material illustrated in FIGS. 1A to 1D may be provided with lines of weakness, perforations. Alternatively, the web material may be non-perforated, in which case the dispenser may be provided with a cutting arrangement or tearing arrangement for separating a sheet from the tail of web material. One or more packages, i.e., bundles, of folded web material are arranged to be placed in the web material storage section of the dispenser to form a stack of folded web material.

The tail of the web material may be arranged to extend from the upper end portion or the lower end portion of the web material storage section to a dispensing opening of the dispenser. The tail of the web material may change direction one or more times inside the dispenser between the upper end portion of the web material storage section and the dispensing opening.

Preferred web materials or sheets of materials are such that are suitable for forming absorbent tissues or towels, like paper towels or hand towels, for personal use, e.g., for wiping the hands of a user after wash, for napkins, or for object wiping purposes. It is also possible to have single sheets of material in a stack, wherein the user is able to grab the single sheet of paper through the dispensing opening. Similar to the web materials, single sheet of materials are such that are suitable for forming absorbent tissues for personal use, e.g., for wiping the hands of a user after wash, for napkins, or for object wiping purposes.

The terms "web material" and "single sheet of material" are herein to be understood to include tissue paper materials, nonwoven materials, and materials being a mixture of tissue paper and nonwoven materials.

The term "tissue paper" is herein to be understood as a soft absorbent paper and may be creped or non-creped. The creping may take place in wet or dry condition. The tissue paper may be made by TAD or atmos-methods. The fibers contained in the tissue paper are mainly pulp fibers from chemical pulp, mechanical pulp, thermo mechanical pulp, chemo mechanical pulp and/or chemo thermo mechanical pulp (CTMP). The tissue paper may also contain other types of fibers enhancing e.g,. strength, absorption or softness of the paper. These fibers may be made from regenerated cellulose or synthetic material such as polyolefins, polyesters, polyamides etc.

The term "nonwoven" is applied to a wide range of products which in term of their properties are located between the groups of paper and cardboard on the one hand and textiles on the other hand. As regards nonwovens a large number of extremely varied production processes are used, such as airlaid, wet laid, spunlaced, spunbond, meltblown techniques etc. The fibers may be in the form of endless fibers or fibers prefabricated with an endless length, as synthetic fibers produced in situ or in the form of staple fibers.

Alternatively, they may be made from natural fibers or from blends of synthetic fibers and natural fibers.

The web material and material sheets may be recycled flexible material, newly-produced material or a combination thereof.

Figure 2A:
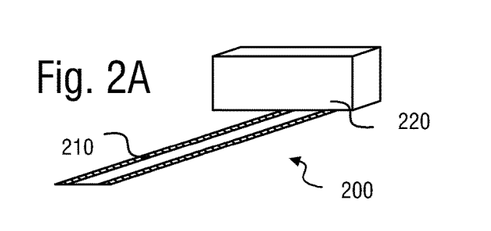
FIG. 2A is a first schematic perspective view of a sensor device including a measurement section and a capacitive sensor.

FIG. 2A shows a sensor device 200 that may be arranged to detect a filling status of a consumable in a dispenser, for example dispensers 110 and 130 storing different type of consumables as shown in FIGS. 1A to 1D. The consumable may be any web material as described in more detail above and may be the stacks of web material 114 as shown in FIGS. 1A to 1C or may be a roll of web material as illustrated in FIG. 1D.

The filling status relates to a spatial extension of the consumable in the dispenser. The filling status may indicate a filling amount in the dispenser with consumable, the filling amount being related to a spatial extension of the consumable in the dispenser in one direction, the consumable being web material. For example, dispenser 110 of FIG. 1A may hold consumables of the type stack of folded web material, stack of single sheets of material, stack of diapers, stack of sanitary napkins or the like extending in height. In this embodiment, the filling status may relate to a spatial extension of the stack of consumable in height. The filling status may further relate to the number of bundles of web material existing in the dispenser 110.

The filling status may either indicate whether the dispenser is fully loaded with consumables or whether the dispenser is empty, wherein the dispenser needs to be refilled with new consumables or bundles of consumables when being empty. In addition, it is also possible that the filling status shows the amount of consumables left in the dispenser with a higher granularity, such that a continuous detection of the filling status of the dispenser is possible. Thus, the sensor device 200 as illustrated in FIG. 2A may be configured to measure the status of a dispenser more accurately compared to another sensor which only measures the two states of the dispenser being full or empty.

In an embodiment containing a dispenser 130 according to FIG. 1D a sensor device 200 as illustrated in FIG. 2A may be also arranged to detect a filling status of a consumable in the dispenser 130. The consumable for a dispenser like dispenser 130 of FIG. 1D may be web material rolled up on a roll located inside of the dispenser 130. As described in more detail above, the consumable may be a paper roll where paper is consumed from the inside of the roll or a paper roll where paper is consumed from the outside of the roll.

Again, the filling status relates to a spatial extension of the consumable, like the paper roll, in the dispenser. In this embodiment, the filling status may then indicate a filling amount in the dispenser with consumable, the filling amount being related to a spatial extension of the consumable in the dispenser in one direction, the consumable being web material. For example, dispenser 130 of FIG. 1D may hold consumable of the type web material being rolled up as a roll and extending in width, i.e. extending from the center of the roll outwards. In this embodiment, the filling status may relate to a spatial extension of the consumable rolled up as a roll in width, i.e. a spatial extension of the consumable rolled up as a roll from the center of the roll outwards.

As described for a dispenser similar to dispenser 110 of FIG. 1A, the filling status may either indicate whether the dispenser 130 of FIG. 1D is fully loaded with consumables or whether the paper roll placed in dispenser 130 is empty, thus having no material rolled up, wherein the dispenser needs to be refilled with a new roll of consumables when being empty. In addition, it is also possible that the filling status shows the amount of consumables left in the dispenser with a higher granularity, such that a continuous detection of the filling status of the dispenser is possible. Thus, the sensor device 200 as illustrated in FIG. 2A may be configured to measure the status of a dispenser more accurately compared to another sensor which only measures the two states of the dispenser being full or empty.

The sensor device 200 may comprise a capacitive sensor 210 as illustrated in FIG. 2A, the capacitive sensor 210 comprising an elongated and planar sensor area. The elongated and planar sensor area may be a stripe stretching in the direction of the spatial extension of the consumable in the dispenser in order to detect the filling status of the dispenser.

Figure 2B:
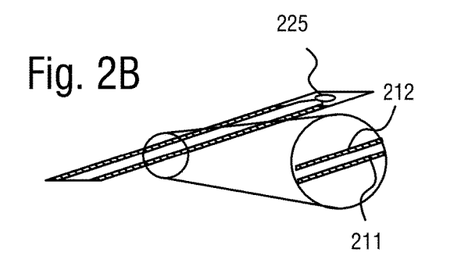
FIG. 2B is another perspective view of a portion of the sensor device.
Figure 2C:
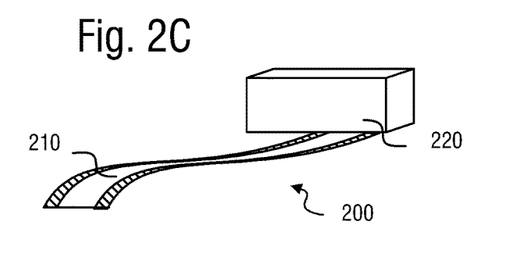
FIG. 2C is a further perspective view of another portion of the sensor device.

The sensor device 200 may further comprise a first measurement section 225 configured to measure the filling status of the dispenser. The first measurement section 225 as shown in FIG. 2B may be located on the elongated and planar sensor area or may be part of an electronic housing part 220 as illustrated in FIGS. 2A, 2C, and 2E. The electronic housing part 220 may contain all electronic parts related to the sensor device 200, for example capacitance to digital converter integrated circuit and a microcontroller (not shown). The capacitance to digital converter integrated circuit may receive the capacitance measured by the capacitive sensor 210 and convert the measured capacitance to digital data. The digital data may be used by the microcontroller to calculate the filling status of the dispenser. As described in more detail above, the first measurement section is configured to accurately and precisely measure the filling status of the dispenser with high granularity.

Figure 3:
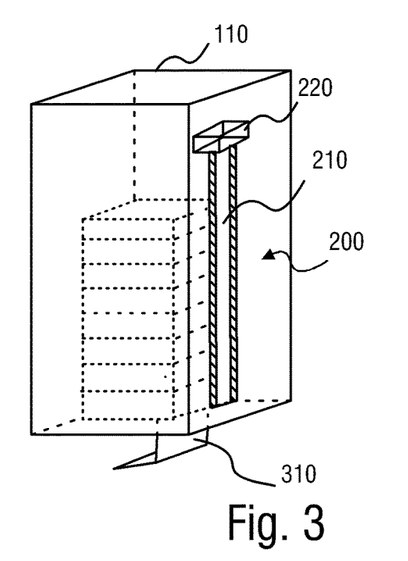
FIG. 3 is a perspective view of a dispenser containing a stack of folded web material and a sensor device mounted in the dispenser.

As further illustrated in FIG. 2B, the capacitive sensor 210 may comprise a first channel 211 and a second channel 212, wherein the first measurement section is configured to measure the filling status of the dispenser based on changes in capacitance detected by the first channel 211 and the second channel 212. The first channel 211 and the second channel 212 may be some kind of strip lines which may be parallel to each other and may be elongated in the direction of the spatial extension of the consumable in the dispenser. In the context of the present invention, the term "channel" or "strip line" refers to a strip-like conductor, wherein the first channel 211 and the second channel 212 may be strip-like conductors. In particularly, the first channel 211 and the second channel 212 may be the capacitor plates of the capacitive sensor.

The capacitive sensor 210 may detect the change of capacitance utilizing the two channels 211 and 212 as the presence of materials close to the capacitive sensor have a different dielectric constant than air and thus affect the capacitance between two conductors. Due to changes in the capacitance transmitted to the first measurement section 225, the first measurement section 225 is able to determine the filling status of the dispenser with consumable. More details concerning the configuration of the first channel 211 and second channel 212 will be given below with reference to FIG. 3.

The first channel 211 and the second channel 212 may be arranged on a substrate, the substrate with the two channels forming a flexible elongated and planar sensor area. The substrate may be, for example, a type of foil, preferably plastic foil, paper foil, or the like. The substrate may be also some kind of shielding material in order to shield the capacitive sensor 210 on the backside. The purpose of the shielding material may be to improve the accuracy of the measurement and block objects behind the dispenser, such as wall etc., that may affect the measurement in a negative way. The shielding material may consist of metal, such as copper, wherein the shielding may be a solid ground plane or a hatched ground plane. Between the first and second channels 211, 212 and the shielding material, insulation material, such as polyimide etc., may be placed to enhance the accuracy of the measurement. The first channel 211 and the second channel 212 may be, for example, metal foil, copper lines, copper foils, aluminum foil, conductive ink, gold plated, silver, tinned, or the like placed on the substrate.

Instead, of placing the two channels on a substrate, the first channel 211 and the second channel 212 may be placed directly on a surface of the dispenser.

The length of the capacitive sensor 210 and thus of the two channels and, if provided, of the substrate may be either preconfigured depending on the size and height of the dispensers in which the sensor device 200 is mounted; or may be cut individually by a user to accurately and precisely fit the capacitive sensor 210 in the dispensers. In order to be able to cut the capacitive sensor 210 to individual length by ordinary means, e.g., by a pair of scissors, the thickness of the capacitive sensor 210 should preferably not exceed a specific threshold. In particular, the thickness of the capacitive sensor 210, i.e. of the substrate and the two channels 211, 212, or of the two channels 211, 212 if no substrate is provided, may be in any one of the following ranges: 4 μm to 500 μm, 100 μm to 300 μm, 190 μm to 210 μm, or approximately 200 μm. By configuring the thickness of the capacitive sensor 210 as described above, it is ensured that the capacitive sensor 210 can be easily and flexibly cut into various lengths depending on the size of dispenser. Instead of cutting the capacitive sensor 210, the capacitive sensor 210 may be provided with lines of weakness, perforations, such that a user may easily tear the capacitive sensor 210 into various lengths depending on the size of the dispenser.

Independent of whether or not a substrate is provided, the capacitive sensor 210 including the first channel 211 and the second channel 212 may be a flexible elongated and planar sensor area which can be bent as illustrated in FIG. 2C. By ensuring the flexibility of the capacitive sensor 210, the sensor device 200 is configured to be mounted in any type of dispenser independent of the size, shape, and structure of the dispenser, as the capacitive sensor 210 is adaptive to be mounted on any surface of the dispenser.

Figure 2D:
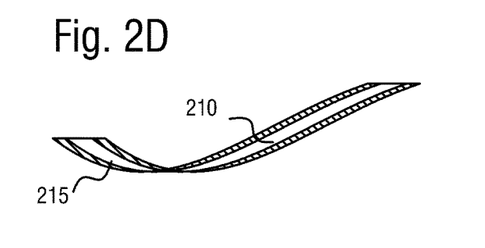
FIG. 2D is yet another perspective view of a further portion of the sensor device.
Figure 2E:
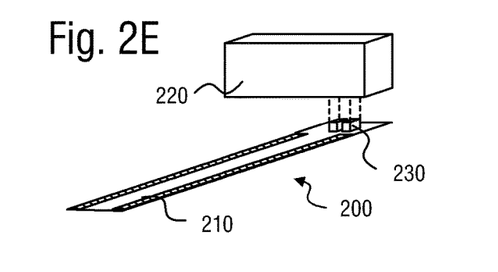
FIG. 2E is a perspective view of another state of the sensor device.

In another embodiment, as further illustrated in FIG. 2D, the capacitive sensor 210 may have an adhesive back side 215, the adhesive back side engaging the capacitive sensor 210 with the dispenser for measuring the filling status of the dispenser. In particular, the adhesive back side 215 of the capacitive sensor 210 may attach the capacitive sensor 210 to a surface or a wall of the dispenser. For instance, the adhesive back side 215 may fix the capacitive sensor 210 to the surface or wall of the dispenser by using tape. The adhesive back side 215 including tape may be covered by protection foil. In order to place the capacitive sensor 210 in the dispenser, the elongated and planar sensor area of the capacitive sensor 210 may be rolled out and positioned in the dispenser. Then, the protection foil may be removed from the tape of the adhesive back side 215 and the elongated and planar sensor area may be attached to a surface inside of the dispenser, for example a wall of the dispenser. If the capacitive sensor 210 comprises a substrate, the substrate may comprise the adhesive back side 215. If the capacitive sensor 210 does not comprise a substrate, the first channel 211 and the second channel 212 may both contain adhesive back sides 215. The adhesive back side 215 may grant view of the first channel 211 and second channel 212 as illustrated in FIG. 2D or may not grant view of the two channels 211 and 212.

FIG. 2E illustrates a further embodiment of the sensor device 200, wherein the capacitive sensor including the first channel 211 and the second channel 212 may be configured to engage with the electronic housing part 220 and may be further configured to engage with the dispenser for measuring the filling status of the dispenser.

For instance, as illustrated in FIG. 2D, the capacitive sensor 210 may comprise a capacitive sensor member 230 which has a respective counterpart in the electronic housing part 220 (not shown). The capacitive sensor member 230 and the respective counterpart in the electronic housing part may be able to mate/engage such that the capacitive sensor 210 can be attached to the electronic housing part, i.e., can be clicked into place. Any system for attaching the capacitive sensor 210 to the electronic housing part 220 may be used.

If the first measurement section 225 is included in the electronic housing part 220, the electronic housing part may also be attached to the surface or wall inside of the dispenser for measuring the filling status. In order to fix the electronic housing part 220 to the dispenser, the electronic housing part 220 may comprise an electronic housing part member configured to engage with a corresponding dispenser member of the dispenser (not shown). The electronic housing part member and the dispenser member may be mating connectors or fasteners, wherein one member of the electronic housing part member and the dispenser member is a "female" connector that receives and holds the other member, i.e., the "male" connector. Any other system for fixing the electronic housing part 220 to the dispenser, like glue, tape, etc., may be used for fixing the electronic housing part to the dispenser for measuring the filling status.

Now, an embodiment of a dispenser having a mounted sensor device 200 is described in more detail. This embodiment is also illustrated in FIG. 3, wherein the embodiment of FIG. 3 shows a dispenser being equal to dispenser 110 of FIG. 1A. Dashed lines in FIG. 3 and other following Figures illustrate objects, i.e., stacks of folded web material, being placed in the dispenser which cannot be seen from the outside. The sensor device 200 is not illustrated with dashed lines but is also placed inside of the dispenser to be able to measure the filling status of the dispenser.

As illustrated as an embodiment in FIG. 3, a stack of web material 310 comprising a plurality of bundles of web material may be stored in dispenser 110 equal to the dispenser of FIG. 1A, wherein the stack of web material 310 may be bundles of continuous folded web material, or bundles of non-continuous web material. The stack, bundles, or single elements of web material are illustrated as an example as dotted lines in FIG. 3.

The sensor device 200 may be mounted inside of the dispenser 110 such that the sensor device 200 may be positioned the closest to the web material for accurately measuring the filling status of the dispenser 110. The sensor device 200 may be mounted on the back wall of the dispenser 110 as illustrated in FIG. 3 since the distance between the web material and sensor device 200 may be the shortest compared to mounting the sensor device 200 on the side walls of the dispenser 110. The sensor device 200, however, may be mounted anywhere inside of the dispenser 110 in order to detect the web material stored in the dispenser 110.

For example, the back wall of the dispenser 110 may be chosen for mounting the sensor device in order to measure the filling status more accurately. A disadvantage of mounting the sensor device 200 on a side wall of the dispenser 110 may be less accurate measurement results due to air space between the web material and the sensor device 200. The existence of an unfolded continuous paper web in the uppermost part of the dispenser housing as illustrated in the embodiment of FIG. 1C will not affect the accuracy of the detection of the filling status. It will be the same as if there would have been merely air above the uppermost remaining bundle in the dispenser. One aspect of filling status detection of either type of stack systems or any other type of roll systems is that the stack or bundle of web material should be positioned close to the strip of the sensor device. Preferably, the sensor device may be positioned not more than 1 cm away from the stack or roll of consumable. Preferably the strip is positioned/attached to the back wall of the inside of the dispenser housing in order to secure such a close distance.

In this embodiment, the capacitive sensor 210 is attached to the electronic housing part and the electronic housing part 220 is attached to a surface of the dispenser 110. If the first measurement section 225 having the circuitry for measuring the filling status of the dispenser 110 is included in the capacitive sensor 210, the respective steps of attaching the capacitive sensor 210 to the electronic housing part 220 and attaching the electronic housing part 220 to a surface of the dispenser 110 are omitted.

In FIG. 3, the capacitive sensor 210 comprising the elongated and planar sensor area may be mounted by first engaging the capacitive sensor 210 with the electronic housing part 220 as described above with reference to FIG. 2D.

For mounting the electronic housing part 220 including the first measurement section 225, the walls of dispenser 110 may be preconfigured in order to keep the electronic housing part 220 of the sensor device 200 in place. One possibility may be that the dispenser 110 may have multiple dispenser members mounted on the surfaces of the dispenser, wherein the electronic housing part 220 can be fixed to the dispenser 110 by having a corresponding electronic housing part member. A user may thus be able to choose the location for mounting the sensor device 200 in the dispenser 110 by selecting one dispenser member and then clicking the electronic housing part 220 into place by engaging the electronic housing part member with the selected dispenser member. The configurations of the members have been described in more detail above and any method for attaching the electronic housing part 220 to the dispenser 110 may be used.

Once the capacitive sensor 210 has been attached to the electronic housing part 220 and the electronic housing part 220 has been attached to a surface inside of the dispenser 110, the elongated planar sensor area of the capacitive sensor 210 may be rolled out and may be attached to the surface inside of the dispenser 110 by using the adhesive back side 215 of the capacitive sensor 210. In FIG. 3, the capacitive sensor 210 is fixed vertically on the back wall of the dispenser 110, such that the first channel 211 and the second channel 212 included in the capacitive sensor 210 are elongated in the direction of the spatial extension of the stack of web material in order to measure the filling status of the dispenser 110.

In order to be able to measure the filling status of the dispenser 110, the first measurement section is configured to analyze the changes of the capacitance detected by the capacitance sensor 210. As described above, the first channel 211 and the second channel 212 may be the conductor plates being situated next to each other, wherein the consumable stored in the dispenser 110 may be the dielectric medium. As the filling status of the dispenser 110 changes, i.e., the level of web material stored in the dispenser 110, the dielectric value and thus the capacitance changes. These changes are detected by the capacitance sensor 210 and then evaluated by the first measurement section 225 or the electric housing part 220, if the electric housing part 220 includes the first measurement section 225. If the capacitance is high, the first measurement section 225 determines that the dispenser 110 is full with consumable and thus the filling status is high. If, on the other side, the capacitance is low, the first measurement section 225 determines that the dispenser 110 is not full with consumable and a user, janitor, or someone from the cleaning staff may need to refill the dispenser 110. In this matter, by changing capacitance the filling status of the dispenser 110 may be accurately and precisely measured.

For example, if users of a washroom use the dispenser 110 storing paper towels, the supply of paper towels in the dispenser 110 shrinks over time and the height of the stack of paper towels decreases. The changes of capacitance due to changes in the dielectric value, i.e., due to a decreasing stack of paper towels, may be detected by the capacitive sensor 210 and may be transmitted to the first measurement section 225 which may determine the filling status of the dispenser 110. By changing capacitance, the first measurement section 225 is able to determine the height of the stack of consumables and thus the filling status of the dispenser 110.

Figure 4A:
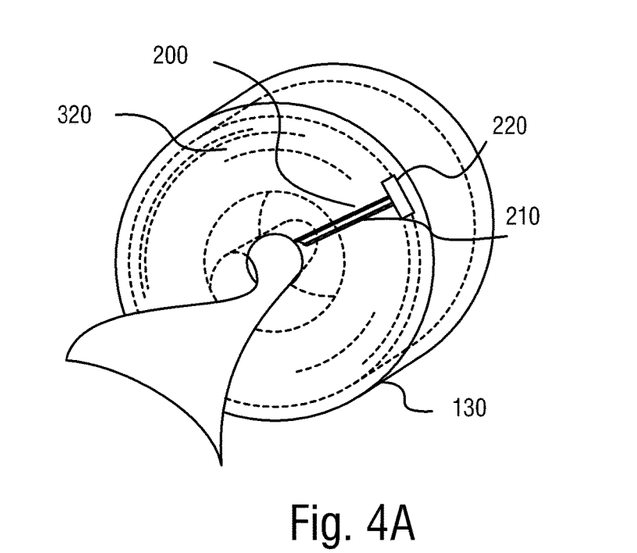
FIG. 4A is a perspective view of a dispenser and a roll of web material in combination with a sensor device.

Another embodiment of mounting the sensor device 200 in a dispenser is illustrated in FIG. 4A, wherein the dispenser is equal to a dispenser type as illustrated in FIG. 1D. The dispenser 130 of FIG. 4A may store web material rolled up on a roll 320 as can be, for example, often seen for toilet paper. The roll of web material 320 may decrease in width over time depending on the usage of the dispenser 130.

In order to measure the filling status of the dispenser 130, a sensor device 200 may be mounted in the dispenser 130, the sensor device 200 detecting the width of the roll of web material 320 stored in the dispenser 130. For better intelligibility, the roll of web material 320 is illustrated without the dispenser 130 in FIG. 4B, wherein the width W of the roll of web material 320 relates to the spatial extension of the web material 320 from the center of the roll of web material 320 to the outmost outline of the roll of web material 320. The width W of the roll of web material 320 may change depending on how much web material is rolled up on the roll. The web material is either consumed from the inside of the roll or from the outside of the roll.

Figure 4B:
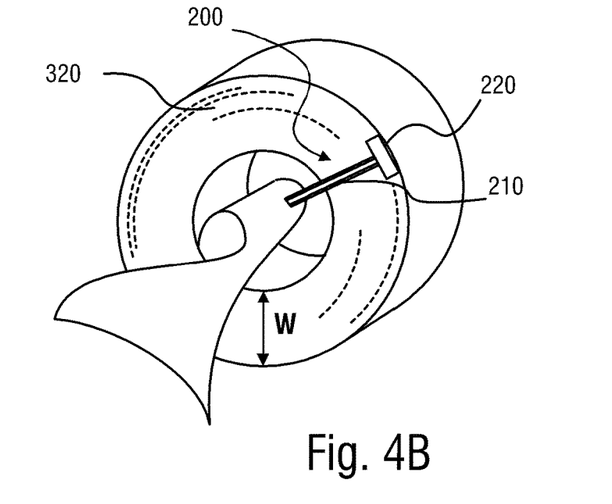
FIG. 4B is another more detailed view of the dispenser and elements of FIG. 4A.

In order to measure the width W of the roll of web material 320 to determine the filling status of the dispenser 130, the sensor device 200 is mounted along the radius of the roll of web material 320 as illustrated in FIGS. 4A and 4B. The mounting of the sensor device 200 and the measurement of the consumable stored in the dispenser 130, i.e., the measurement of the filling status of dispenser 130, are similar to the configuration as illustrated in FIG. 3 for dispenser 110 of the previous embodiment. Thus, for conciseness, a detailed description is omitted at this point.

By mounting the sensor device 200 along the radius of the roll, accurate and precise measurement of the filling status of the dispenser 130 can be performed independent of whether the web material is consumed from the inside or from the outside of the roll. Thus, a sensor device 200 is provided which broadens the scope of dispenser types while ensuring full functionality and more accurate data relating to the filling status of the dispenser.

Figure 5A:
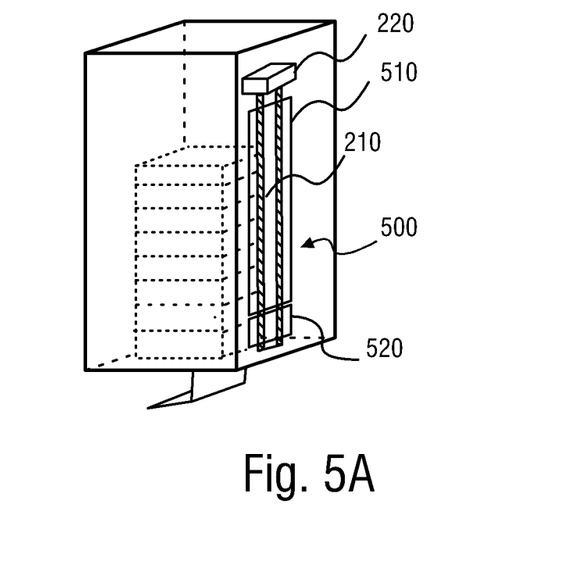
FIG. 5A is a perspective view of a dispenser and a sensor device, the sensor device including multiple measurement sections.

Another embodiment of a sensor device 500 is illustrated in FIG. 5A, wherein the sensor device 500 is similar to sensor device 200 having a capacitive sensor 210 and a first measurement section, wherein the first measurement section is included in an electronic housing part 220. It is also possible to remove the electronic housing part 220 from the sensor device 500 and place the first measurement section on the capacitive sensor 210 as described in more detail above with respect to FIGS. 2A to 2D.

Figure 5B:
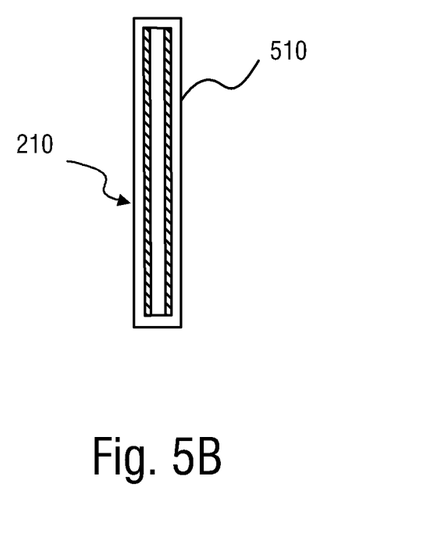
FIG. 5B is a further view of a sensor device that may be used with the dispenser of FIG. 5A.
Figure 5C:
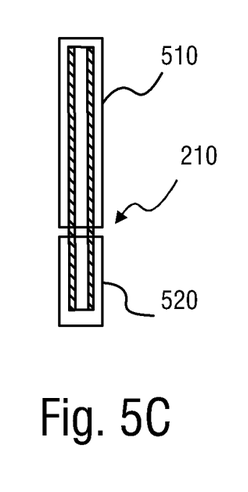
FIG. 5C is another view of a sensor device that may be used with the dispenser of FIG. 5A.

Furthermore, the sensor device 500 may comprise a second measurement section which may be mounted on the capacitive sensor 210 or in the electronic housing part 220, as illustrated in FIG. 5A. In this embodiment, the capacitive sensor 210 is divided into two sensor areas 510 and 520 (in FIG. 5A framed with black boxes for illustration), wherein the first measurement section determines the filling status from the changes in capacitance of the first sensor area 510 and wherein the second measurement section determines the filling status from the changes in capacitance of the second sensor area 520. The first and second sensor areas 510 and 520 are also illustrated in FIG. 5C, wherein the black boxes are added to the capacitive sensor 210 for illustration of the two sensor areas 510 and 520. The first and second sensor areas 510, 520 both have a first channel and a second channel, wherein the two channels detect changes in capacitance as described above with respect to channels 211 and 212. Thus, a detailed description is omitted at this point.

As stated above, the second measurement section may be configured to determine the filling status of the second sensor area. The second sensor area may have a predetermined height, the height being for example equal to the height of a bundle of web material. The first measurement section may be configured to adapt the measurement of the filling status of the dispenser by calculating a capacitance reference value obtained on the basis of the height of the bundle of the web material corresponding to the predetermined height of the second sensor area. Thus, some kind of calibration for measuring the filling status of the dispenser is possible leading to more accurate and precise measurement results.

Alternatively or additionally, an option may be that the second measurement section may be configured to measure the humidity in the air, wherein the first measurement section may be configured to adapt the measurement of the filling status of the dispenser to the humidity in the air measured by the second measurement section. By considering the humidity in the air and thus the dampness of the consumable stored in the dispenser, the filling status of the dispenser can be measured more accurately. That is, the measurement of the changes in capacitance by the capacitive sensor 210 for determining the filling status of the dispenser may be affected by the consistence of the consumable to be detected and may result in imprecise measurement results. For example, moisture in the web material may affect the capacitance meaning that the capacitance may be higher compared to web material stored in dry air. Thus, measurement results relating to the filling status may be distorted.

In order to avoid distortion of the measurement results, the second measurement section may be used to draw conclusions on the dampness of the web material, wherein the moisture/dampness, i.e., the difference in capacitance compared to a measurement in dry air, is used as reference to accurately measure the filling status of the dispenser. In FIGS. 5A and 5C, the sensor device 500 may be divided into two sensor areas 510 and 520, wherein the electronic housing part 220 contains both the first measurement section and the second measurement section and wherein the sensor device 500 is placed in a dispenser similar to dispenser 110 of FIG. 1A. However, the sensor device 500 comprising the second measurement section may be placed in any types of dispensers including a type of dispenser 130 illustrated in FIG. 1D. If solely one measurement section is provided, the first measurement section regards the whole range of the capacitance sensor 210 to detect the filling status. This embodiment is illustrated in FIG. 5B.

The measurements of the second measurement section may be used as reference for the measurements of the first measurement section. For example, the second sensor area 520 may be for example as high as the height of one bundle of web material and may cover the bundle of web material close to the dispensing opening. If the first measurement section detects web material due to a capacitance value being above a predetermined threshold, the sensor device 500 concludes that the capacitance value measured by the second measurement section relates to a second sensor area 520 being fully covered with consumable. The capacitance value measured by the second measurement section is then used as reference by the sensor device 500 with regard to the capacitance value measured by the first measurement section to detect the filling status of the whole dispenser. Thus, humidity in the air is for example indirectly considered.

Another option is to place a sensor, for example a sensor measuring the humidity in the air, as second measurement section close to the dispensing opening of the dispenser for directly detecting the humidity in the air. When the humidity in the air is determined, the results of the measurement of the humidity in the air are transmitted to the electronic housing part. The electronic housing part may comprise a humidity sensor unit to process the humidity value detected by the second measurement section and to adapt the measurement of the first measurement section to the measured humidity. Thus, deviations in the measurements for the filling status may be compensated.

Figure 5D:
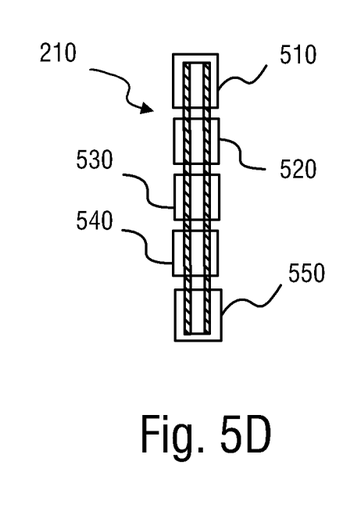
FIG. 5D is a further view of a sensor device that may be used with the dispenser of FIG. 5A.
Figure 5E:
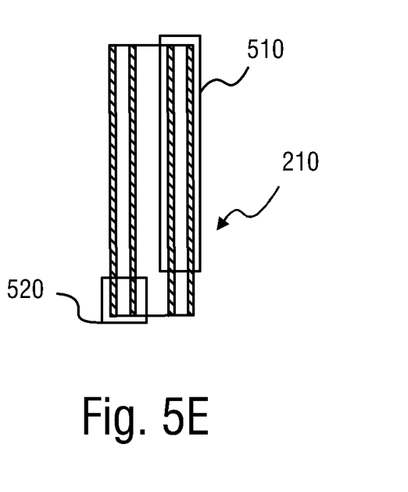
FIG. 5E is yet another view of a sensor device that may be used with the dispenser of FIG. 5A.

FIGS. 5D and 5E illustrate further embodiments for the sensor device 500, wherein in FIG. 5D the range of the capacitance sensor 210 is divided into more than two sensor areas 510 to 550, each having a respective measurement section. In this embodiment, each sensor area 510 to 550 covers one bundle of web material and the respective measurement sections each measure the height of one bundle of web material. By combining the measurement results of the multiple measurement sections, the filling status of the dispenser can be precisely and accurately determined.

FIG. 5E shows another embodiment, wherein the sensor areas 510 and 520 are placed next to each other, instead of one above the other. This setup does not change how the filling status is determined and how the sensor device 500 works in comparison with the other setups described with respect to FIGS. 5A to 5D. Thus, a detailed description is omitted at this point.

For a more accurate detection of a filling status of a dispenser, the sensor device may be further configured to detect types of web material stored in the dispenser, the type of web material being differentiated by the thickness of the web material, the size of the web material and/or the material composition of the web material. In order to do so, the web material stored in a dispenser may be prepared with some kind of strip or barcode which the sensor device is able to detect. By detecting the type of web material, the sensor device assesses the changes in capacitance depending on the type of web material resulting in a more accurate and more precise detection of the filling status. Instead of preparing the web material with some kind of strip or barcode, the web material may be prepared with a conductive substance in order to be able to distinguish between different types of web material.

Once the filling status of a dispenser has been measured, the filling status can be notified to a user by the sensor device, for example a user being responsible for refilling the dispenser with consumable, a janitor or cleaning stuff. The user may be alerted when refilling of a dispenser is needed or alarmed when a dispenser is nearly empty, i.e., when the amount of consumable in a dispenser falls below a preconfigured threshold.

Moreover, the dispenser may be for example configured to output light through a light-emitting diode (LED) stripe or any other lighting device. The filling status may be indicated by different hues, wherein the filling status can be output with high granularity. The hues may for example range from the color green (the dispenser being full with consumables) over orange (the dispenser being half-full) to the color red (the dispenser being empty), wherein the granularity can be regulated by regulating the amount of hues to be displayed.

Figure 6:
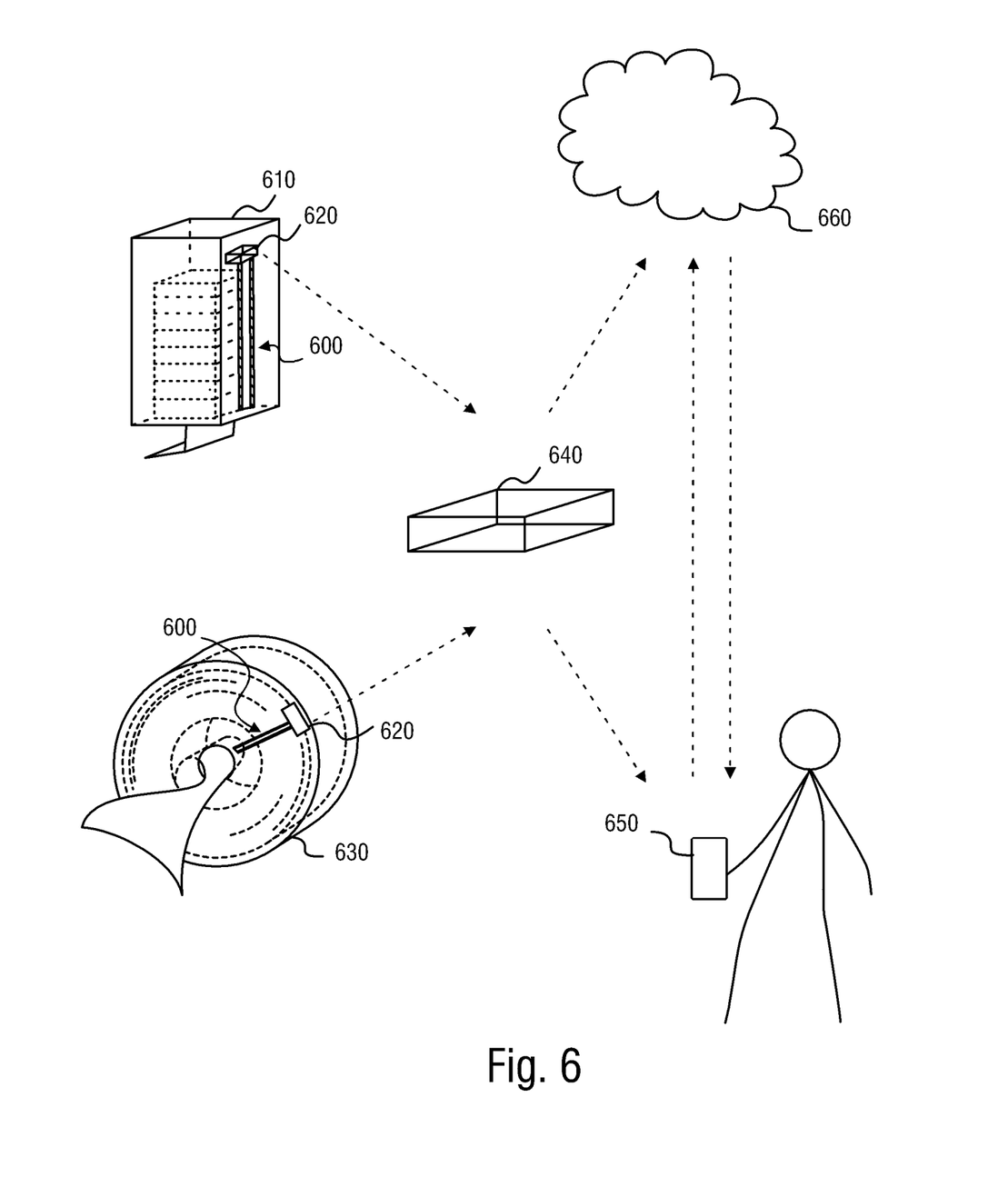
FIG. 6 is a schematic view of a scenario with sensor devices in dispensers employing transmission of data to a data collection unit according to one embodiment.

Another embodiment is illustrated in FIG. 6, wherein sensor devices 600, being similar to the sensor device 200 or 500 as described in more detail above, are configured to transmit data to a data collection unit 640, the data indicating the filling status of any kind of dispensers 610, 630, etc. The data collection unit 640 may incorporate any one of a gateway, a server, and application functionalities. The data collection unit 640 may be able to connect wirelessly to the sensor devices 600 mounted in dispensers 610, 630 or may be able to connect to the sensor devices 600 via wire. The data of the sensor devices 600 is usually collected by, for example, one or more networks such as wire-less or wire-bound, short-range or long-range networks (e.g. IrDA, IEEE802.15.4, Zigbee, RF4CE, SP1C0, IEEE802.il, Bluetooth™, GSM, PCS, UMTS, 3GPP, LTE, WLAN, LAN, the Internet, and the like).

In this embodiment, the sensor devices 600 may detect the filling status of the dispensers 610, 630 and may forward the data about the filling status of the dispensers 610, 630 to the data collection unit 640. In this matter, the electronic housing parts 620 of the sensor devices 600 may contain radio communication components to be able to communicate with the data collection unit 640 and to transmit the data relating to the filling status of the respective dispensers 610, 630 to the data collection unit 640. The radio communication components may establish a wireless connection, e.g., Zigbee etc., between the sensor devices 600 and the data collection unit 640. The data relating to the filling status may be a value of a range from 0% to 100% (0%: dispenser being empty, 100%: dispenser being full), a binary value (0: dispenser being empty, 1: dispenser being full), a command, or the like.

The data collection unit 640 may then send the data about the filling status of the respective dispensers 610, 630 to a user device 650 or a cloud system 660 for further processing. The user device 650 may be any personal computing device such as smart phone, desktop computer, tablet, smart watch, laptop computer, or the like, and may display the data received from the data collection unit 640. The user device 650 may further be able to communicate bi-directionally with the cloud system 660, wherein any kind of data may be transmitted between the user device 650 and the cloud system 660.

A user, for example a janitor or cleaning staff, may check the displayed data on the user device 650 to easily and quickly check the filling status of a particular dispenser. The user device 650 may be furthermore configured to output an alarm and/or to alert the user once one of the dispensers 610, 630 is empty or once the filling status of one of the dispensers 610, 630 falls under a threshold. The cloud system 660 may be used to store the filling status of the dispensers 610, 630 connected to the data collection unit 640 and to further process the data about the filling status of the dispensers 610, 630 if needed.

Figure 7A:
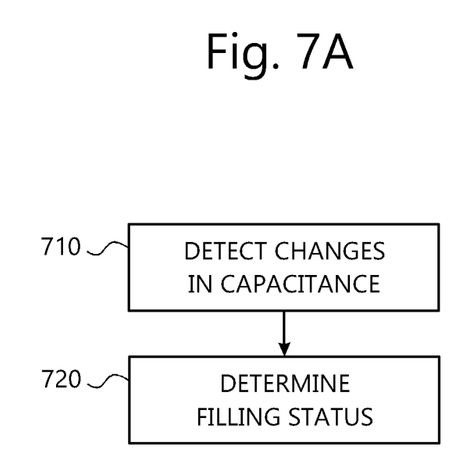
FIG. 7A is a schematic flow chart of one method for detecting a filling status of a consumable in a dispenser.
Figure 7B:
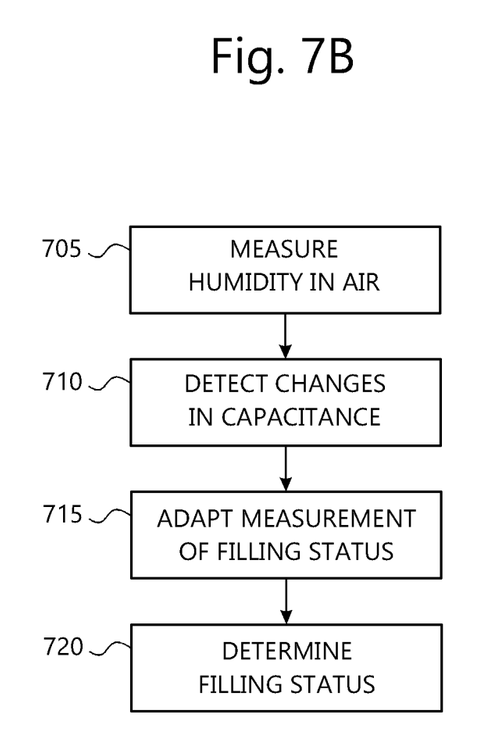
FIG. 7B is a schematic flow chart of another method for detecting a filling status of a consumable in a dispenser.
Figure 7C:
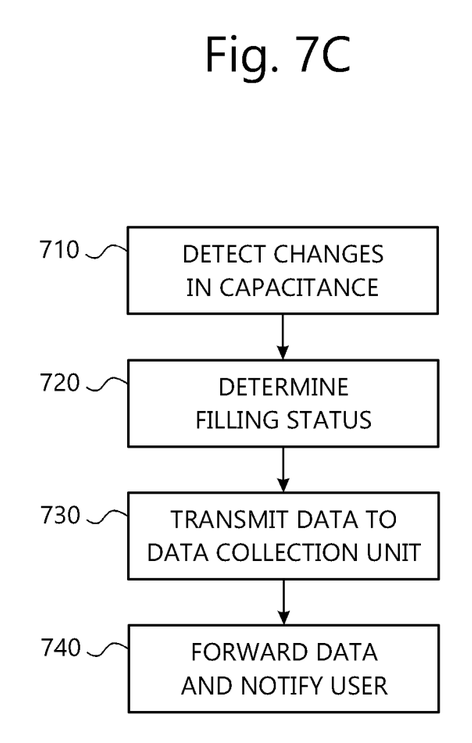

FIGS. 7A to 7C relate to methods of embodiments for detecting a filling status of a consumable in a dispenser.

In more detail, the flowchart of FIG. 7A describes a method for detecting a filling status of a consumable in a dispenser, the consumable being web material and the filling status relating to a spatial extension of the consumable in the dispenser. The method as illustrated in FIG. 7a comprises step 710, wherein changes in capacitance are detected by a capacitive sensor as described in more detail above. The capacitive sensor comprises an elongated and planar sensor area, wherein the capacitive sensor comprises a first channel and a second channel. The second step 720 comprises measuring, by a first measurement section, the filling status of the dispenser depending on the detected changes in capacitance, wherein the first measurement section is configured to measure the filling status of the dispenser based on changes in capacitance detected by the first channel and the second channel. Determining the filling status of a dispenser may include anything of measuring, calculating, and/or processing the changes in capacitance by the capacitance sensor in order to determine the filling status of the dispenser.

The flowchart of FIG. 7B describes a variation of the method as illustrated in FIG. 7A. In FIG. 7B, the method comprises the step 705 of measuring, by a second measurement section of a sensor device, the humidity in the air. As the second measurement section has been described in detail above, further explanation is omitted for conciseness. Step 710 of FIG. 7B is equal to step 710 of FIG. 7A and comprises detecting changes in capacitance by the capacitive sensor. In step 715, the measurement of the filling status is then adapted depending on the measured humidity in the air. By considering the humidity in the air and by adapting the measurement of the filling status, the filling status can be determined more accurately and more precisely, as the capacitance of the capacitive sensor changes depending on the humidity in the air. Thus, distortion of the measurement results relating to the filling status may be avoided.

After adapting the measurement of the filling status, the filling status can be determined accurately and precisely in step 720 of FIG. 7B. It should be noted that the order of the steps 705 to 720 of FIG. 7B is not fixed and the order of the steps 705 to 720 can be rearranged compared to the embodiment shown in FIG. 7B.

Another embodiment of a method for detecting the filling status of a dispenser is illustrated by a flowchart in FIG. 7C. Steps 710 and 720 are equal to the steps 710 and 720 of FIGS. 7B and 7C. Steps 705 and 715 of FIG. 7B may also be included in the embodiment of FIG. 7C but are omitted due to conciseness reasons.

As shown in FIG. 7C, step 710 comprises detecting changes in capacitance of the dispenser by a capacitive sensor and step 720 comprises determining, by a measurement section, the filling status of the dispenser. After having obtained data about the filling status of the dispenser, a sensor device comprising the capacitive sensor and the measurement section may transmit the obtained data to a data collection unit as described in more detail with reference to FIG. 6 (step 730). The data collection unit may then forward the data to a user device and/or cloud and may notify the user of the user device about the filling status of the dispenser.

Figure 8A:
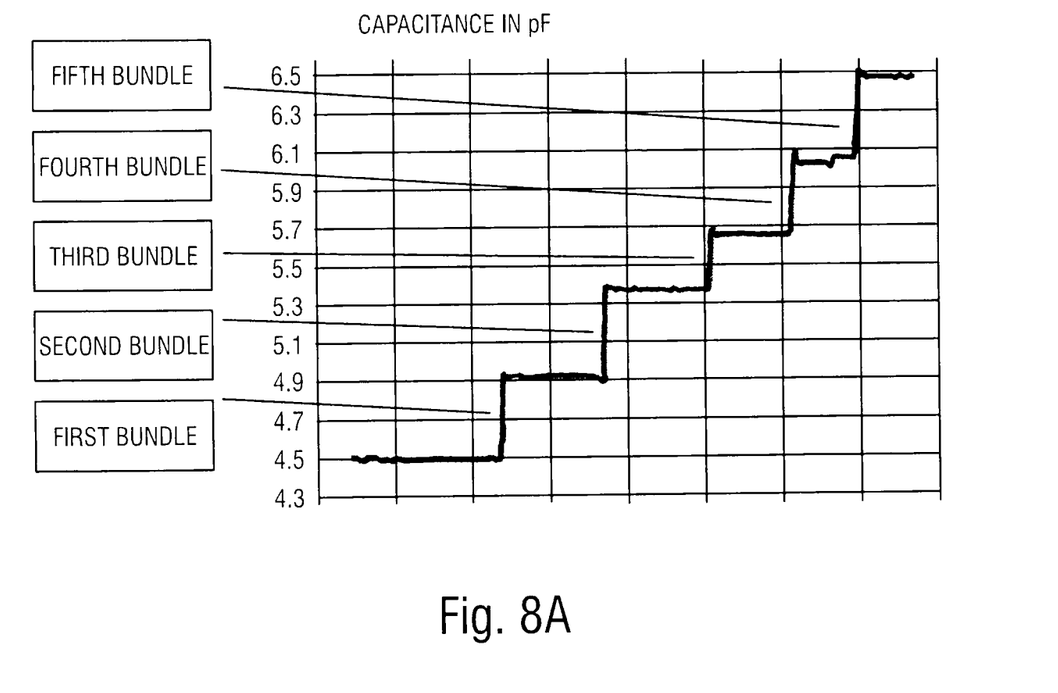
FIG. 8A is a graphical plot of data from capacitance to digital converter.
Figure 8B:
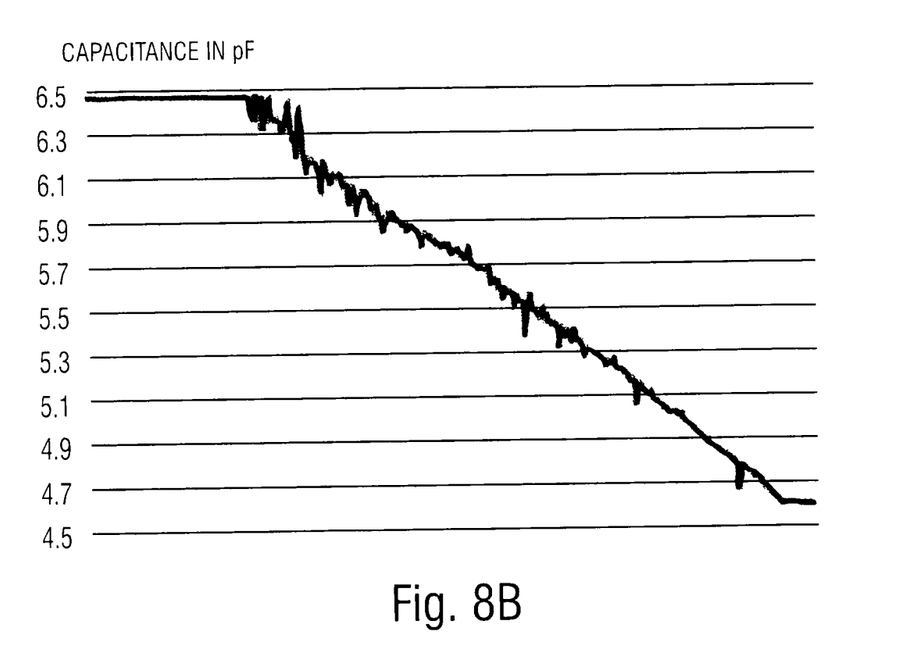
FIG. 8B is another graphical plot of data from capacitance to digital converter.

FIGS. 8A and 8B show data from a sensor device mounted in a dispenser. FIG. 8A shows an embodiment when the dispenser is filled up with five bundles of consumable. The graph of FIG. 8A shows that the capacitance value increases when more bundles of consumables are being filled in the dispenser. In FIG. 8B, consumables, for example paper towels, are pulled from the dispenser until the dispenser is empty. The graph of FIG. 8B shows that the capacitance value decreases over time when more and more paper towels are pulled from the dispenser. From the graphs shown in FIGS. 8A and 8B, it can be seen that the capacitance increases in steps for every bundle that is loaded in the dispenser and decreases for every consumable, i.e. web material being pulled out from the dispenser. Thus, the filling status of the dispenser can be measured accurately and precisely with high granularity.

Although detailed embodiments have been described, these only serve to provide a better understanding of the invention, and are not to be seen as limiting.

The embodiments described above are descriptions of preferred embodiments of the present invention, and are not intended to limit the scope of the present invention. Various variations and modifications can be made by those of ordinary skill in the art, without departing from the design and scope of the present invention. The variations and modifications should all fall within the claimed scope defined by the claims of the present invention.

What is claimed is:

1. A sensor device arranged to detect a filling status of a consumable in a dispenser, the consumable being web material, the filling status relating to a spatial extension of the consumable in the dispenser, the sensor device comprising:

a capacitive sensor comprising an elongated and planar sensor area; and
a first measurement section configured to measure the filling status of the dispenser;
wherein the capacitive sensor comprises a first channel and a second channel; and
wherein the first measurement section is configured to measure the filling status of the dispenser based on changes in capacitance detected by the first channel and the second channel.

2. The sensor device according to claim 1, wherein the sensor device is configured to transmit data to a data collection unit, the data indicating the filling status of the dispenser.

3. The sensor device according to claim 1,
the consumable being web material of continuous or non-continuous sheets of paper towels, toilet paper, tissue paper, facial tissues, or nonwoven wipe, the sheets being folded into stacks or rolled into a roll.

4. The sensor device according to claim 1,
wherein the sensor device is further configured to detect types of web materials stored in the dispenser, the type of web material being differentiated by at least one of a thickness of the web material, a size of the web material and a material composition of the web material.

5. The sensor device according to claim 1,
wherein the first measurement section is included in an electronic housing part, the electronic housing part comprising a member configured to engage with a corresponding member of the dispenser; and
wherein the capacitive sensor including the first channel and the second channel is configured to engage with the electronic housing part and with the dispenser.

6. The sensor device according to claim 1, wherein the capacitive sensor comprises an adhesive back side, the adhesive back side engaging the capacitive sensor with the dispenser.

7. The sensor device according to claim 1, further comprising a second measurement section.

8. The sensor device according to claim 7, wherein the second measurement section is configured to measure a humidity in the air,
wherein the first measurement section is configured to adapt a measurement of the filling status of the dispenser to the humidity in the air measured by the second measurement section.

9. The sensor device according to claim 7, wherein the second measurement section is configured to determine the filling status of a sensor area, the sensor area having a predetermined height; and
wherein the first measurement section is configured to adapt a measurement of the filling status of the dispenser by calculating a capacitance reference value obtained on a basis of a height of a bundle of the web material corresponding to the predetermined height.

10. The sensor device according to claim 5,
wherein the capacitive sensor comprises an adhesive back side, the adhesive back side engaging the capacitive sensor with the dispenser;
the sensor device further comprising a second measurement section;
wherein the second measurement section is configured to measure a humidity in the air, wherein the first measurement section is configured to adapt a measurement of the filling status of the dispenser to the humidity in the air measured by the second measurement section;

wherein the second measurement section is configured to determine the filling status of a sensor area, the sensor area having a predetermined height; and wherein the first measurement section is configured to adapt a measurement of the filling status of the dispenser by calculating a capacitance reference value obtained on a basis of a height of a bundle of the web material corresponding to the predetermined height;

wherein the sensor device is configured to transmit data to a data collection unit, the data indicating the filling status of the dispenser;

the consumable being web material of continuous or non-continuous sheets of paper towels, toilet paper, tissue paper, facial tissues, or nonwoven wipe, the sheets being folded into stacks or rolled into a roll; and wherein the sensor device is further configured to detect types of web materials stored in the dispenser, the type of web material being differentiated by at least one of a thickness of the web material, a size of the web material and a material composition of the web material.

11. A dispenser for dispensing consumable, the consumable being web material, the dispenser comprising:

a storage section arranged to hold and support the consumable;

a loading opening arranged for filling up the dispenser with the consumable;

a dispensing opening from which the consumable is arranged to be lead for dispensing thereof; and a sensor device arranged to detect a filling status of the consumable in the dispenser, the filling status relating to a spatial extension of the consumable in the dispenser, the sensor device comprising:

a capacitive sensor comprising an elongated and planar sensor area; and a first measurement section configured to measure the filling status of the dispenser;

wherein the capacitive sensor is configured with a first channel and a second channel; and wherein the first measurement section is configured to measure the filling status of the dispenser based on changes in capacitance detected by the first channel and the second channel.

12. The dispenser according to claim 11, wherein the first measurement section is included in an electronic housing part, the electronic housing part comprising a member configured to engage with a corresponding member of the dispenser;

wherein the capacitive sensor including the first channel and the second channel is configured to engage with the electronic housing part and with the dispenser;

wherein the capacitive sensor comprises an adhesive back side, the adhesive back side engaging the capacitive sensor with the dispenser;

the sensor device further comprising a second measurement section;

wherein the second measurement section is configured to measure a humidity in the air, wherein the first measurement section is configured to adapt a measurement of the filling status of the dispenser to the humidity in the air measured by the second measurement section;

wherein the second measurement section is configured to determine the filling status of a sensor area, the sensor area having a predetermined height and wherein the first measurement section is configured to adapt a measurement of the filling status of the dispenser by calculating a capacitance reference value obtained on a basis of a height of a bundle of the web material corresponding to the predetermined height;

wherein the sensor device is configured to transmit data to a data collection unit, the data indicating the filling status of the dispenser;

the consumable being web material of continuous or non-continuous sheets of paper towels, toilet paper, tissue paper, facial tissues, or nonwoven wipe, the sheets being folded into stacks or rolled into a roll; and wherein the sensor device is further configured to detect types of web materials stored in the dispenser, the type of web material being differentiated by at least one of a thickness of the web material, a size of the web material and a material composition of the web material.

13. A method for detecting a filling status of a consumable in a dispenser, the consumable being web material, the filling status relating to a spatial extension of the consumable in the dispenser, the method comprising the steps of:

detecting changes in capacitance by a capacitive sensor comprising an elongated and planar sensor area; and measuring, by a first measurement section, the filling status of the dispenser depending on the detected changes in capacitance;

wherein the capacitive sensor comprises a first channel and a second channel; and wherein the first measurement section is configured to measure the filling status of the dispenser based on changes in capacitance detected by the first channel and the second channel.

* * * * *